Dec. 12, 1967 A. SCHWARZMANN 3,358,214
FREQUENCY MULTIPLIERS UTILIZING SELF-RESONANT DIODE MOUNTS
Filed Feb. 25, 1965
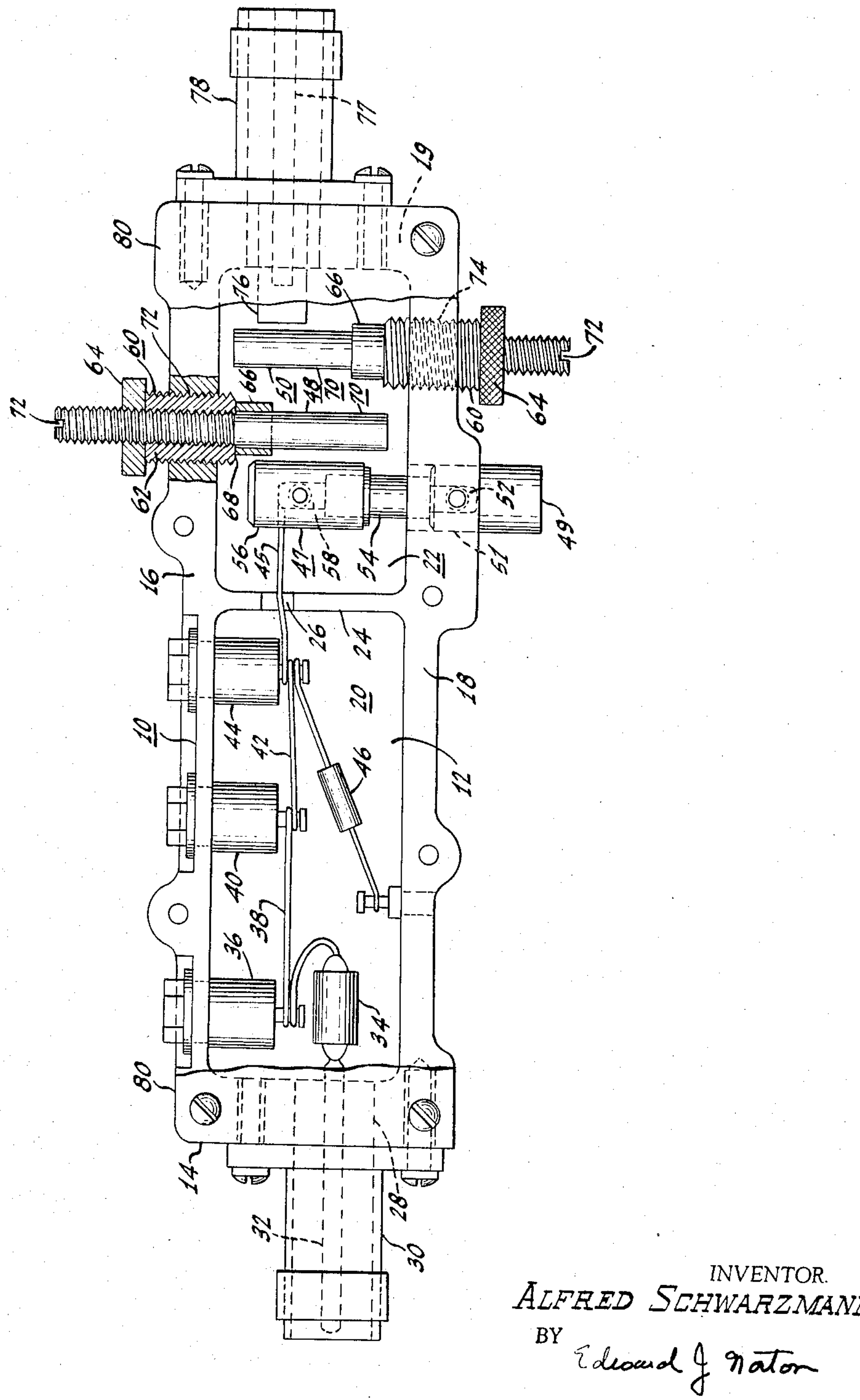
INVENTOR.
ALFRED SCHWARZMANN
BY Edward J. Nator
Attorney 3,358,214
FREQUENCY MULTIPLIERS UTILIZING SELF-RESONANT DIODE MOUNTS

Alfred Schwarzmann, Pennsauken, N.J., assignor to Radio Corporation of America, a corporation of Delaware Filed Feb. 25, 1965, Ser. No. 435,235
7 Claims. (Cl. 321—69)

ABSTRACT OF THE DISCLOSURE

There is disclosed a frequency multiplier circuit which uses a non-linear diode in a rod-like mount, the mount being dimensioned to be resonant at a desired multiple of an input frequency. The mount is also dimensioned to be resonant with an external tuning element at an idling frequency. The idling frequency is also a suitable multiple of the input frequency to obtain efficient multiplication from the non-linear element. The output is coupled through a relatively narrow bandpass filter to enable a desired multiplied frequency to appear at the output of the filter with a minimum of circuit adjustment.

This invention relates to frequency multipliers and more particularly to frequency multipliers providing output waves at frequencies in the range of several thousand megacycles.

One method of producing oscillations at frequencies in the range of several thousand megacycles at useful power levels involves the use of klystrons or traveling wave tubes. Such devices are expensive, heavy, fragile, bulky, and require heating currents and relatively high operating voltages. In order to avoid such disadvantages, it has been suggested that oscillations first be produced at lower frequencies and at useful power levels which can readily be accomplished by cheaper, lighter, less bulky and sturdier equipment requiring no heater currents and using relatively low voltage supplies. The low frequency oscillations so produced are then multiplied up to the desired frequency range.

It is an object of this invention to provide an improved frequency multiplier.

It is a further object of this invention to provide a light, sturdy, and relatively efficient frequency multiplier for providing oscillations at useful power levels in the several thousand megacycles range.

Another object of this invention is to provide an improved frequency multiplier that will produce oscillations at any one of a number of frequencies without varying the tuning of the frequency multiplier.

In accordance with one embodiment of this invention, a hollow chamber is provided having a self-resonant mount positioned in the chamber, the mount including a solid state diode as part thereof. The diode can be a varactor, that is a diode whose capacity varies with a voltage applied thereacross, or it can be a step recovery diode. The self-resonant mount is tuned to a predetermined frequency which is a first integral multiple, such as four, of one of a band of input frequencies to be multiplied. The diode mount is also resonant, with additional capacity to other adjacent conductive structure in the chamber, to an idler frequency; that is to a frequency which is a second lower integral multiple, such as three, of the one frequency in the band of frequencies. The multiplier multiplies with a high efficiency any frequency of an input wave in the band of input frequencies by the first integral multiple without change in the tuning of any component thereof. The multiplier can also include an input band pass filter and means for matching the impedance of the band pass filter to the resonant mount. Means can also be provided to match the self-resonant mount to an output for the multiplier.

The novel features of the invention, both as to its organization and method of operation, as well as additional objects and advantages thereof, will be understood more readily from the following description, when read in conjunction with the accompanying drawing in which;

The sole figure is a plan view of one embodiment of a frequency multiplier constructed according to this invention with a top closure plate broken away.

The frequency multiplier of this invention is shown in the drawing as comprising a hollow structure 10 of generally rectangular shape having a floor 12 and four walls 14, 16, 18, and 19. The structure 10 is separated into two chambers, a right chamber 20 and a left chamber 22 as viewed in the figure, by a common wall 24 having a slot 26 extending from the upper edge of the wall 24 part way down to the bottom thereof. A hole 28 extends through one wall, the left wall 14 of the left chamber 20, and a concentric input 30 is provided for the multiplier having a center conductor 32 extending into the left or first chamber 20. A first capacitor 34 is connected between the inner end of the conductor 32 and one terminal of a further capacitor 36 whose other terminal is grounded to a wall 16 of the left chamber 20. A connection 38 extends from the one or ungrounded terminal of the capacitor 36 to a terminal of a third capacitor 40, and another connection 42 extends from that terminal of the third capacitor 40 to a terminal of a fourth capacitor 44. The other terminals of the third and fourth capacitors 40 and 44 are also grounded to the left chamber wall 16. The inductance of the several connections between the several capacitors 34, 36, 40, 44 taken with the capacity thereof comprises a band pass filter for passing waves of a band of input frequencies. If more inductance is necessary, connections 38 and 42 can comprise one or more turns. A resistor 46 is connected between the ungrounded terminal of the fourth capacitor 44 and a wall 18 of the chamber for purposes to be disclosed. An output connection 45 is affixed to the ungrounded terminal of the fourth capacitor 44 and extends through the slot 26 into the second or right hand chamber 22 of the structure.

A plurality of tuning stubs 47, 48 and 50 of adjustable lengths extend from the side walls 16 and 18 into the second chamber 22. One stub 47 constitutes a self-resonant mount which is resonant due to its length to a pre-determined frequency which can be an integral multiple (such as four times) the frequency of a wave in the central portion of the pass band of the band pass filter in the first chamber 20. This self-resonant mount 47 comprises an outer conductive portion 49 which is mounted in a hole 51 in the wall 18 of the second chamber 22. The outer portion 49 is formed with a socket to receive one terminal 52 of a diode 54 which comprises the intermediate portion of the resonant mount 47. The inner portion 56 of the mount 47 comprises a further conductor formed as a socket to receive the other terminal 58 of the diode 54. The length of the mount 47 within the chamber 22 is adjustable by sliding the outer portion 49 in its hole 51 to make the mount 47 resonant at the said predetermined resonant frequency. The polarity of the diode 54 (the direction in which the diode 54 is placed in the mount 47) is chosen to provide the best heat sinking thereof to the hollow structure 10. Otherwise the polarity of the diode 54 is of no importance. The connector 45 connected to the fourth capacitor 44 is connected to a point along the inner portion 56 so as to best match the impedance of the band pass filter and of the self-resonant structure 47. Also, by this connection, due to voltage build-up across the resistor 46 upon rectification of the applied wave by the diode 54, the diode 54 is biased to distort the applied or input wave whereby waves of many frequencies appear across the self-resonant structure 47, the wave of the desired output frequency being resonated by the self-resonant mount structure 47.

While the diode 54 can take different forms, either a voltage variable capacitance diode (varactor) or a step-recovery diode can be used. Both the varactor and the step-recovery diode are PN junction devices. In the varactor, the transition capacitance nonlinearity is responsible for the production of the harmonics. In the case of a step recovery diode, the generation of harmonics is due to a short current pulse determined by the minority carrier depletion time rather than the transition capacitance. Both the varactor and the step-recovery diode possess these characteristics but the difference is in the degree of emphasis. By way of example only, a varactor diode, RCA type V–7010, was used in a quadrupler frequency multiplier of the invention which provided an output frequency of 4.7 kmc.±7 percent at 100 milliwatts. The diode was characterized by a breakdown voltage of 60 volts±10 volts, junction capacitance at −6 volts at one picofarad ±50 percent, and junction series resistance of one ohm±50 percent. It was found that by the construction described herein frequency multipliers having efficiencies up to thirty percent with 5 percent band width and up to twelve percent with 14 percent band width are provided.

The second stub 48, which is of adjustable length, extends from the wall 16 into the second chamber 22. This stub 48 includes a conductive bushing 60 having an intermediate diameter, externally threaded body portion 62 and a larger diameter flange portion 64, which may be knurled, at one end thereof. The body portion 62 also includes a smaller unthreaded sleeve 66 extending from the other end thereof, providing a shoulder 68 between the body portion 62 and the sleeve 66. The inner surface of the bushing 60 is threaded for the greater part of its length. However, the inner surface of the bushing 60 adjacent the sleeve 66 and the interior of the sleeve 66 are not threaded. The stub 48 also includes a conductive post 70 which is threaded for about half of its length and which is provided with a kerf 72 at the threaded end thereof for the reception of a screwdriver blade. By rotating the bushing 60 in its threaded hole 72 in the wall 16 and thusly determining the length of the post 70 and bushing 60 of the stub assembly 48 extending into the chamber 22, the capacity of the self-resonant mount 47 is adjusted to make the mount 47 also resonant to an idler frequency. The idler frequency is equal to an integral multiple of an intermediate frequency of the pass band of the input band pass filter. In a practical application, the idler frequency can be equal to the difference between the desired output frequency and the input frequency. Assuming that the frequency multiplier is intended to operate as a quadrupler such that the mount 47 is resonant at a frequency equal to four times the input frequency, the stub assembly 48 is adjusted to cause the diode mount 47 to also be resonant at an idler frequency equal to three times the input frequency. The post 70 is shown as threaded into the bushing 60 so that its unthreaded portion extends into the chamber 22 to tune the chamber to a desired frequency.

Considering the electrical characteristics of the diode mount arrangement, it is believed that its operation can be explained as a three branch network with the diode 54 as the mutual element. The first or input branch tuned to the input frequency band includes the connection 45 and the diode 54. The second or idler branch tuned to the idler frequency includes the diode 54, the effective length of the inner portion 56 of the mount 47 and the distributed capacitance to ground, the distributed capacitance including that to the adjacent networks including the stub assembly 48. The third or output branch tuned to the output frequency band includes the diode and only the distributed capacitance between the diode mount 47 and the stub assembly 48.

The third stub 50, which is constructed and adjusted similarly to the stub 48, is positioned in a hole 74 in the wall 18 through which the self-resonant mount 46 extends. However, the bushing 60 of the stub 50 performs substantially only the function of providing an adjustable mounting for the post 70 of the stub 50. The length of the two posts 70 forming a part of the stub assemblies 48 and 50 are adjusted to give the second chamber 22 a band pass characteristic which may be extended from about 7 percent above to about 7 percent below the frequency of the self-resonant mount 46. Therefore, any wave of a frequency that passes the band pass filter in the first chamber 20 and which has a harmonic which differs from the frequency of the self-resonant mount by not more than about 7 percent results in a harmonic appearing in the second chamber 22. No adjustment of any element of the described multiplier is required in the production of such a harmonic. The tuning of the resonant mount 46 to the higher frequency causes it to resonate at the desired harmonic frequency and to select the desired output frequency. Since the self-resonant mount 46 is also resonant at a lower or idler frequency, it selects and resonates a wave of that lower frequency from the distorted waves produced by the diode 54 upon application of an input wave thereto. This lower frequency wave is intermodulated with the applied wave, due to the action of the diode 54, to produce a wave of the desired output frequency. In the example given, the wave energy at the third harmonic, in effect, adds to that of the input wave to provide additional output wave energy at the fourth harmonic. Since this intermodulated wave of the desired output frequency is produced without increasing the input power and is added to the frequency multiplied wave otherwise produced by the tuning of the self-resonant mount 47 to the desired output frequency, the efficiency of the frequency modulator is increased by this double tuning of the self-resonant mount 47.

A sleeve 76 extends into the second chamber 22 through the wall 19 thereof in proximity with the stub 50 to provide an output path for the multiplier wave. The sleeve 76 is mounted on the inner conductor 77 of a concentric output means 78. The position of the sleeve 76 along the stub 50 and the distance between the end of the sleeve 76 and the stub 50 are chosen so that matching is provided between the band pass filter means of the second chamber 22 and the output means 78.

The chambers 20 and 22 may be enclosed by a plate 80, which is broken away in the drawing to provide clarity of illustration.

Although only a single frequency multiplier has been described, it will undoubtedly be apparent to those skilled in the art that variations thereof are possible within the spirit of the invention. Hence it should be understood that the foregoing description is to be considered as merely illustrative and not in a limiting sense.

What is claimed is:

1. A frequency multiplier for providing an output wave of a frequency which is a multiple of the frequency of any one of a band of input waves while retaining an original adjustment of said frequency multiplier comprising a hollow chamber, a rod-like, self-resonant diode mount resonant at an integral multiple of the frequency of one input wave included in said band of input waves and extending into said chamber, conductive means extending into said chamber in proximity to said self-resonant mount and providing sufficient capacity between said self-resonant mount and said conductive means to make said self-resonant mount also resonant at a second multiple integral of the frequency of said one input wave lower than said first multiple, means for supplying an input wave of a frequency within said band to said mount causing a frequency multiplied wave to appear in said chamber, and means for applying said frequency multiplied wave to an output means.

2. A frequency multiplier for providing an output wave of a frequency which is a multiple of the frequency of any one of a band of input waves while retaining an original adjustment of said frequency multiplier comprising a chamber, a rod-like self-resonant mount extending into said chamber from a wall thereof and resonant at a predetermined frequency, said mount including a diode along the length thereof, bias means for said diode, a conductive structure extending into said chamber in the vicinity of said self-resonant mount and providing a capacity between said mount and said conductive structure to render said mount also resonant at a frequency lower than said predetermined frequency, and means to apply an input wave to be multiplied to said self-resonant mount, said predetermined frequency and said lower frequency both being harmonics of a wave having a frequency within said band of waves.

3. A frequency multiplier for providing an output wave of a frequency which is a multiple of the frequency of any one of a band of input waves while retaining an original adjustment of said frequency multiplier comprising a chamber, a variable capacitance diode having two terminals in said chamber, a conductive socket member for one of said terminals including said one terminal and conductively fixed to a wall of said chamber, a conductive socket member for the other of said terminal and extending into said chamber, said two sockets members and said diode forming a self-resonant mount resonant at a predetermined frequency, bias means for said diode, a conductive structure extending into said chamber in the vicinity of said mount and providing capacity between said mount and said conductive structure to render said mount resonant at a second frequency lower than said predetermined frequency, means to apply an input wave having a frequency within a band of frequencies to be multiplied to said mount, said predetermined frequency and said lower frequency each being an integral multiple of a wave in said band, and means in the form of a second conductive structure extending into said chamber to render said chamber resonant over a band of frequencies surrounding the resonant frequency of said mount.

4. A frequency multiplier for providing an output wave of a frequency which is a multiple of the frequency of any one of a band of input waves while retaining an original adjustment of said frequency multiplier comprising a band pass filter having input and output terminals, a chamber having a self-resonant mount connected to a wall of said chamber and extending thereinto, said self-resonant mount comprising a diode having terminals and a pair of conductive elements individually connected to said diode terminals with one of said conductive elements conductively connected to said wall of said chamber, a connection from said output terminal to said other one of said conductive elements, said resonant mount being resonant to a frequency which is a first integral multiple of a frequency in the pass band of said band pass filter, means to apply biasing potential to said diode, means in said chamber to provide capacity to said mount to render said mount resonant to a second lower integral multiple of said frequency in said pass band, and means extending into said chamber to render said chamber resonant over a band of frequencies surrounding the resonant frequency of said resonant mount.

5. A frequency multiplier for providing an output wave of a frequency which is a multiple of the frequency of any one of a band of input waves while retaining an original adjustment of said frequency multiplier comprising a first and a second chamber having a wall in common, said wall having an opening therein, wave input means extending through a wall of said first chamber, two capacitors in series connected between said wave input means and a wall of said first chamber, at least one additional capacitor and a resistor each having a terminal connected to a wall of said first chamber, the other terminal of said additional capacitor and of said resistor being connected to the junction of said two capacitors, said capacitors and the connections therebetween comprising a band pass filter, a self-resonant mount in said second chamber, said self-resonant mount comprising two conductive sockets members and a diode whose terminals are respectively received in the sockets of said sockets members, one of said socket members being conductively connected to a wall of said second chamber, a connection from the junction of said two capacitors and the other one of said socket members, said self-resonant mount being resonant at a frequency which is a first integral multiple of an intermediate frequency in said pass band of said band pass filter, a stub conductively connected to a wall of said second chamber and extending thereinto in the vicinity of said mount and providing capacity with said mount to render said mount also resonant at a second lesser integral multiple of said intermediate frequency, a second stub conductively connected to a wall of said second chamber and extending thereinto, said stubs rendering said chamber a band pass filter at frequencies surrounding the resonant frequency of said resonant mount, and wave output means extending through a wall of said second chamber and responsive to waves of said last-mentioned frequencies present in said second chamber.

6. A frequency multiplier as claimed in claim 5 and wherein said diode is a variable capacitance diode exhibiting a transition capacitance nonlinearity.

7. A frequency multiplier as claimed in claim 5 and wherein said diode is a step-recovery diode of the type exhibiting nonlinearity due to a short current pulse determined by the minority carrier depletion time.

(References on following page)

References Cited

UNITED STATES PATENTS

| | | | |
|---|---|---|---|
| 2,408,420 | 10/1946 | Ginzton | 321—60 |
| 3,165,690 | 1/1965 | Kaufman | 321—69 |
| 3,267,352 | 8/1966 | Blight | 321—69 |
| 3,281,648 | 10/1966 | Collins | 321—69 |
| 3,287,621 | 11/1966 | Weaver | 321—69 |
| 3,300,729 | 1/1967 | Chang | 330—4.9 |
| 3,335,357 | 8/1967 | Murphy et al. | 321—69 |

JOHN F. COUCH, *Primary Examiner.*

G. GOLDBERG, *Assistant Examiner.*